United States Patent
Hausmann et al.

(10) Patent No.: US 6,475,902 B1
(45) Date of Patent: Nov. 5, 2002

(54) CHEMICAL VAPOR DEPOSITION OF NIOBIUM BARRIERS FOR COPPER METALLIZATION

(75) Inventors: Gilbert Hausmann, Ben Lomond; Vijay Parkhe; Jagadish Kalyanam, both of San Jose, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/522,635

(22) Filed: Mar. 10, 2000

(51) Int. Cl.⁷ ........................................... H01L 21/4763
(52) U.S. Cl. ........................ 438/627; 438/648; 438/683; 438/771
(58) Field of Search ................................ 438/627, 643, 438/648, 653, 771, 772, 683, 785

(56) References Cited

U.S. PATENT DOCUMENTS

| | | | |
|---|---|---|---|
| 5,139,825 A | 8/1992 | Gordon et al. ............ | 427/255.2 |
| 5,178,911 A | 1/1993 | Gordon et al. ............ | 427/255.2 |
| 5,856,236 A | 1/1999 | Lai et al. .................... | 438/681 |
| 5,900,498 A | 5/1999 | Winter et al. ................. | 556/51 |
| 5,908,947 A | 6/1999 | Vaartstra ...................... | 556/42 |

OTHER PUBLICATIONS

Ajit Paranjpe, Randhir Bubber, Lino Velo, Guihua Shang, Sanjay Gopinath, Jeremie Dalton and Mehrdad Moslehi, "CVD Tan Barrier for Copper Metallization and DRAM Bottom Electrode," IEEE, Jun. 1999, pp. 99–119 to 99–121.

Renaud Fix, Roy G. Gordon, and David M. Hoffman, "Chemical Vapor Deposition of Vanadium, Niobium, and Tantalum Nitride Thin Films," American Chemical Society, 1993, pp. 614–619.

Hoffman D., "Chemical Vapor Deposition of Nitride Thin Films", Polyhedron, vol. 13, p 1169–1179 (1994).*

Tsai et al., "Metalorganic Chemical Vapor Deposition of Tantalum Nitride by Tertbutylimidotris(Diethylamido) Tantalum for Advanced Metallization", Appl. Phys. Lett., vol. 67(8), p 1128–1130 (1995).*

Chiu et al., "Syntheses and Characterization of Organoimido Complexes of Niobium(V); Potential CVD Precursors", J. Chin. Chem. Soc., vol. 45(3), p 355–360 (1998).*

Gordon et al., "Highly Conformal Diffusion Barriers of Amorphous Niobium Nitride", Mat. Res. Soc. Symp. Proc., vol. 564 p 335–340 (1999).*

* cited by examiner

*Primary Examiner*—Michael Sherry
*Assistant Examiner*—Asok Kumar Sarkar
(74) *Attorney, Agent, or Firm*—Moser, Patterson & Sheridan (57) ABSTRACT

A method of depositing a metal nitride material, formed by the decomposition of an organometallic precursor, useful as a barrier layer for an integrated circuit using a conducting metal. More particularly, the invention provides a method of depositing a niobium nitride layer on a substrate for use in copper metallization. In one aspect of the invention an organometallic precursor having the formula $Nb(NRR')_5$, the formula $(NRR')_3Nb=NR"$, or combinations thereof, is introduced into a processing chamber in the presence of a processing gas, such as ammonia, and the metal nitride film is deposited by the thermal or plasma enhanced decomposition of the precursor on a substrate. The deposited niobium nitride layer is then exposed to a plasma to remove contaminants, reduce the film's resistivity, and densify the film.

20 Claims, 6 Drawing Sheets

CHEMICAL VAPOR DEPOSITION OF NIOBIUM BARRIERS FOR COPPER METALLIZATION

BACKGROUND OF THE INVENTION

1. Field of the Invention

The present invention relates to a metallization process for manufacturing semiconductor devices. More particularly, the invention relates to a method for depositing a niobium nitride film by chemical vapor deposition.

2. Background of the Related Art

Reliably producing sub-half micron and smaller features is one of the key technologies for the next generation of very large scale integration (VLSI) and ultra large scale integration (ULSI) integrated circuits. However, as the fringes of circuit technology are pressed, the shrinking dimensions of interconnects in VLSI and ULSI technology has placed additional demands on processing capabilities. The multilevel interconnect features that lie at the heart of this technology require careful processing of high aspect ratio features, such as vias, lines, contacts, and other features. Reliable formation of these features is very important to the VLSI and ULSI success and to the continued effort to increase circuit density and quality of individual substrates and die.

As circuit densities increase, the widths of vias, contacts and other features, as well as the dielectric materials between them, decrease to sub-micron dimensions, i.e., 0.25 $\mu$m or less, whereas the thickness of the dielectric layers remains substantially constant, with the result that the aspect ratios for the features, i.e., their height divided by width, increases. Many traditional deposition processes have difficulty filling sub-micron structures where the aspect ratio exceed 4:1, and particularly where it exceeds 10:1. Therefore, there is a great amount of ongoing effort being directed at the formation of void-free, sub-micron features having high aspect ratios.

Conducting metals such as aluminum and copper are used to fill sub-micron features on substrates during the manufacture of integrated circuits. However, aluminum and copper can diffuse into the structure of adjacent dielectric layers, thereby compromising the integrity of the device. Diffusion, as well as interlayer defects, such as delamination, may be prevented by depositing a liner layer or a barrier layer in a feature before depositing the conducting metal. The liner layer is conventionally composed of a metal that provides good adhesion to the underlying material, such as a titanium liner layer. The barrier layer deposited on the liner layer is often a nitride or silicon nitride of that metal which helps protect the underlying material from interlayer diffusion and chemical reactions with subsequent materials.

With the recent progress in sub-quarter-micron copper interconnect technology, niobium and niobium nitride have become attractive as barrier materials in copper applications. Depending on the application, a diffusion barrier layer may comprise a niobium layer, a niobium nitride layer, a niobium/niobium nitride stack, or in combination with other diffusion barrier materials. Niobium and niobium nitride films have been deposited by both physical vapor deposition (PVD) and to a lesser extent, by chemical vapor deposition (CVD) techniques. However, traditional PVD techniques are not well suited for providing conformal coverage on the wall and floor surfaces of high aspect ratio vias and other features. The ability to deposit conformal niobium nitride films in high aspect ratio features by the decomposition of organometallic precursors has gained interest in recent years for developing metal organic chemical vapor deposition (MOCVD) techniques. In such techniques, an organometallic precursor gas is introduced into the chamber and caused to decompose, allowing the metal portion thereof to deposit a film layer of the metal on the substrate.

Currently, there exists only a few commercially available niobium nitride precursors, and the precursors that are available produce films that have unacceptable levels of contaminants, such as carbon and oxygen, which increase the film's resistivity, and produce films having less than desirable diffusion resistance, low thermal stability, and other undesirable film characteristics. Additionally, as the nitrogen content increases in conducting metal films, the film becomes increasingly resistive, and in the case of niobium nitride, can result in having a film with unacceptably high levels of resistivity, resulting in less than desirable circuit performance.

U.S. Pat. Nos. 5,139,825 ('825) and 5,178,911 ('911) describe the deposition of transitional metal films from dialkylamido compounds at near atmospheric conditions. However, such films generally have less than desirable coverage of sub-micron features formed on a substrate which can lead to void formation in the substrate features and possible device failure. Additionally, the transitional metal films tend to be deposited material on the surfaces of the chamber, which films may subsequently flake or delaminate and become a particle problem within the chamber. Particle deposition in the chamber can produce layering defects in the deposited films and provide less than desirable interlayer adhesion.

Therefore, there remains a need for a process and apparatus for forming conformal metal nitride liner/barrier layers from organometallic precursors in conducting metal metallization, where the metal nitride liner/barrier layers are substantially free of contaminants and have controllable nitrogen contents and controllable film resistivities.

SUMMARY OF THE INVENTION

The present invention generally provides a method of depositing a metal nitride material by the decomposition of an organometallic precursor at sub-atmospheric conditions. The metal nitride material is useful as a barrier layer for a conducting metal in an integrated circuit. In one aspect of the invention an organometallic precursor is introduced into a processing chamber and the metal nitride film is deposited by the thermal or plasma enhanced decomposition of the precursor on a substrate at a pressure of less than about 20 Torr in the presence of a processing gas. The deposited niobium nitride film may then be exposed to a plasma to remove contaminants, reduce the film's resistivity, and densify the film.

The organometallic precursor has the formula Nb(NRR')$_5$, the formula (NRR')$_3$Nb=NRΔ, and combinations thereof, where Nb is niobium, N is nitrogen, and each R, R', and R" is an organic functional group selected from the group of alkyl, alkenyl, cycloalkyl, cycloalkenyl, aryl, and combinations thereof. Preferably, the organic functional groups of R, R', and R" are selected from the group of methyl, ethyl, n-propyl, iso-propyl, n-butyl, sec-butyl, tert-butyl, cyclopentadienyl, benzyl, phenyl, silylated derivatives thereof, fluorinated derivatives thereof, and combinations thereof. The processing gases include nitrogen, hydrogen, ammonia, argon, helium, and combinations thereof, and the post-deposition plasma comprise a gas selected from the group of hydrogen, nitrogen, ammonia, argon, helium, and combinations thereof.

One aspect of the invention provides a method for metallization of a feature on a substrate comprising depositing a dielectric layer on the substrate, etching an aperture within the dielectric layer, depositing a metal nitride layer within the aperture, and depositing a conductive metal layer on the metal nitride layer. The substrate may be optionally exposed to a reactive clean comprising a plasma of hydrogen, argon, and combinations thereof to remove oxide formations on the substrate prior to deposition of the metal nitride layer. The metal nitride layer is niobium nitride deposited by the thermal or plasma enhanced decomposition of an organometallic precursor having the formula $Nb(NRR')_5$, the formula $(NRR')_3Nb=NR"$, or combinations thereof, at a pressure less than about 20 Torr in the presence of a processing gas. To remove contaminants, reduce the resistivity of the layer, and densify the layer, the metal nitride layer may then be exposed to a plasma. The conductive metal is preferably copper and may be deposited by physical vapor deposition, chemical vapor deposition, or electrochemical deposition, such as by electroplating.

Yet another aspect of the invention provides a method of depositing a metal nitride film by delivering a steady flow of the precursor to the chamber. The method comprises delivering a liquid precursor having the formula $Nb(NRR')_5$, the formula $(NRR')_3Nb=NR"$, or combinations thereof to a vaporizer, vaporizing the liquid precursor, selectively delivering the vaporized precursor through a bypass line connected to an exhaust system to stabilize the vaporization process, selectively delivering the vaporized precursor to a processing chamber, depositing a metal nitride film on a substrate by decomposing the vaporized precursor in the presence of a processing gas to deposit the metal nitride film, and selectively delivering the vaporized precursor through the bypass line connected to the exhaust system to stabilize the vaporization process when exposing the deposited metal nitride film to a plasma or during a substrate transfer operation.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

The present invention generally provides for a method of depositing a metal nitride material at sub-atmospheric conditions, formed by the decomposition of an organometallic precursor, useful as a barrier layer for an integrated circuit using a conducting metal. The metal nitride barrier layer is typically used to prevent the diffusion of conducting metals into the adjacent dielectric material which can compromise the integrity of the device being formed. The metal nitride layer can also be used as an liner layer to improve adhesion between adjacent conducting metals and adjacent dielectric material as well as perform as a seed layer in a metal electrochemical deposition process. More particularly, the invention provides a method of depositing a niobium nitride barrier layer on a substrate for use in copper metallization.

In one aspect of the invention, a metal nitride film is deposited when an organometallic precursor having the formula $Nb(NRR')_5$, the formula $(NRR')_3Nb=NR"$, or combinations thereof, is introduced into a processing chamber at a pressure less than about 20 Torr in the presence of a processing gas, such as ammonia. The precursor decomposes thermally or by a plasma enhanced process on a substrate having a temperature above the decomposition temperature of the precursor. The deposited niobium nitride film may then be exposed to a post-deposition plasma to remove contaminants, reduce the resistivity of the film, and densify the film.

The organometallic precursor has the formula $Nb(NRR')_5$, the formula $(NRR')_3Nb=NR"$, or combinations thereof, where Nb is niobium, N is nitrogen, and each R, R', and R" is an organic functional group selected from the group of alkyl, alkenyl, cycloalkyl, cycloalkenyl, aryl, and combinations thereof. Preferably, the organic functional groups of R, R', and R" are selected from the group of methyl, ethyl, n-propyl, iso-propyl, n-butyl, sec-butyl, tert-butyl, cyclopentadienyl, benzyl, phenyl, silylated derivatives thereof, fluorinated derivatives thereof, and combinations thereof. The organometallic precursor is preferably deposited on a substrate heated between about 100° C. and about 450° C., and at a preferable chamber pressure of less than about 20 Torr. The organometallic precursor may decompose by striking a plasma at a power density ranging between about 0.03 W/cm$^2$ and about 3.2 W/cm$^2$, preferably between about 0.6 W/cm$^2$ and about 3.2 W/cm$^2$. For a 200 mm diameter substrate, power is provided at a power level of between about 200 Watts and about 1000 Watts, with about 750 Watts most preferably used. The deposited niobium nitride layer is then exposed to a plasma to remove contaminants, reduce the resistivity of the film, and densify the film. The processing gases include nitrogen, hydrogen, ammonia, argon, helium, and combinations thereof, and the post-deposition plasma comprise a gas selected from the group of hydrogen, nitrogen, ammonia, argon, helium, and combinations thereof.

Another aspect of the invention provides a method for forming a metal nitride barrier layer in a metallization stack in a feature comprising depositing a dielectric layer on a substrate, etching an aperture within the dielectric layer, depositing a metal nitride film within the aperture, and depositing a conductive metal layer on the metal nitride layer. The substrate may be optionally exposed to a reactive clean comprising a plasma of hydrogen and argon to remove oxide formations on the substrate prior to deposition of the metal nitride film. Optionally, a metal layer may be deposited prior to the metal nitride layer to improve interlayer adhesion. The metal layer is a conducting metal, preferably niobium, and is deposited by a chemical vapor deposition or a physical vapor deposition (PVD) technique. The metal nitride layer is deposited on the metal layer by thermal or plasma enhanced decomposition of an organometallic precursor having the formula $Nb(NRR')_5$, the formula $(NRR')_3Nb\!=\!NR''$, or combinations thereof at sub-atmospheric conditions, preferably at a chamber pressure of less than about 20 Torr. The conducting metal is copper, deposited by an electrochemical process, preferably by electroplating.

Yet another aspect of the invention provides a method of delivering a steady flow of the precursor to the chamber by cycling between a deposition mode where the liquid precursors are vaporized and delivered to the chamber and a bypass mode during plasma processing and substrate transfer where the liquid precursors are routed away from the chamber and through a bypass line and into a disposal system. By this method, the system may continually vaporize precursors but deliver the vaporized material to the processing chamber for deposition or to the exhaust system through a bypass line. The continual flow of the vaporized precursor enables stabilization of the deposition process over a number of substrates.

Although the invention is described for copper metallization of a feature, where copper is deposited by an electroplating process, the invention is applicable to other conducting metals that can be deposited by physical vapor deposition, chemical vapor deposition, or electrochemical deposition, such as electroless deposition and electroplating.

Figure 1:
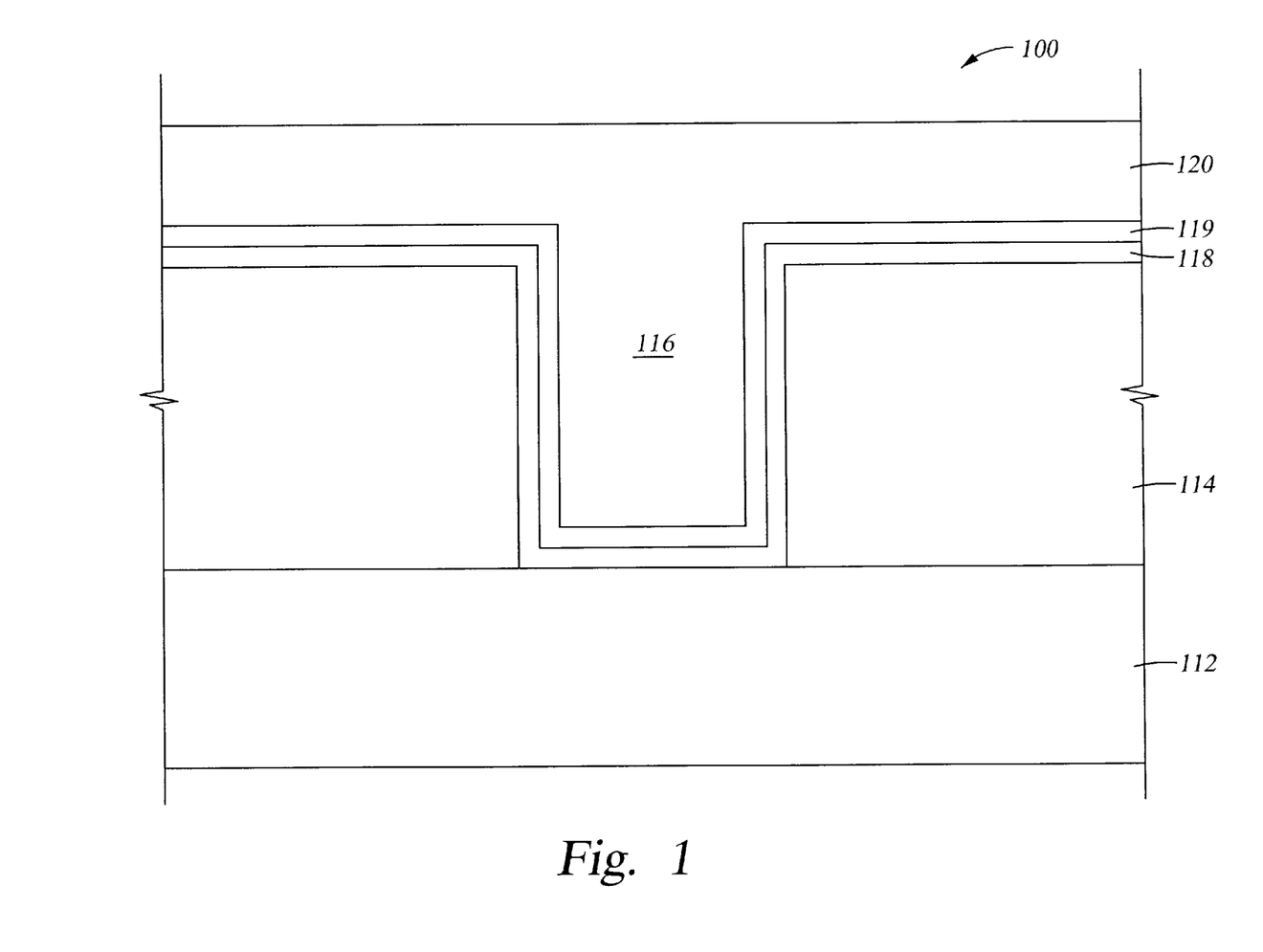
FIG. 1 is cross sectional views of an interconnect in a dielectric layer illustrating a metallization technique for forming such interconnect by the invention.

FIG. 1 is a schematic cross-sectional view of one embodiment of a metallized film stack 100 having an optional liner layer 118 and a barrier layer 119, and conducting metal layer 120 deposited on the barrier layer 119 in a feature 116 formed on a substrate 112. The feature 116 is formed by depositing and etching a dielectric layer 114 on the substrate 112 to form the desired aspect of the feature 116, such as a via, contact, trench or line.

The substrate 112 used for the metal nitride deposition process may be of any material, usually either metallic or ceramic, on which an adherent metallic film can be formed. Preferably, the substrate 112 is a doped silicon substrate, or may be a ceramic material such as glass, thermal oxides, or quartz, or a metal such as aluminum. The substrate 112 may further comprise patterned substrates including those having dielectric layers such as silicon and metal layers such as aluminum and can include a series of underlying layers and interconnects of various materials. For substrate 112 (or substrate films) having melting or softening points below about 1000° C., such as in the case of aluminum and most glasses, a precursor compound whose decomposition temperature is lower than the melting or softening point of the desired substrate must be used.

The dielectric layer 114 can be a pre-metal dielectric layer deposited over a silicon substrate or an inter-level dielectric layer, and is formed over the underlying substrate 112 in accordance with procedures conventionally known in the art to form a part of the overall integrated circuit. Once the dielectric layer 114 is deposited, the dielectric layer 114 can be etched with any dielectric etching or patterning process known in the art, including plasma etching. Specific techniques for etching silicon dioxide and organic materials may include such compounds as buffered hydrofluoric acid and acetone.

For substrates 112 comprising dielectric layers or patterned metal lines, oxides may form on the substrate which can interfere with subsequent layer deposition. In such instances, the substrate surface can be exposed to a reactive clean, which comprises exposing the substrate surface to a plasma, preferably comprising hydrogen, an inert gas, such as argon, and combinations thereof provided at a power density ranging between about 0.03 $W/cm^2$ and about 3.2 $W/cm^2$, or for a 200 mm diameter substrate, at a power of between about 10 Watts and about 1000 Watts to remove any oxides formed thereon. While the reactive clean is described herein, the invention contemplates other oxide removal processes and substrate surface cleaning process, such as nitrogen reduction of oxide formations.

The optional liner layer 118, such as a niobium (Nb) layer, is conformally deposited on the dielectric layer 114 and on the floor and walls of the feature 116, as a transition layer to promote adhesion between the substrate or dielectric layer 114 and the subsequently deposited barrier layer 119 and conducting metal layer 120. The liner layer 118 is considered optional because a subsequently deposited metal nitride barrier layer 119 can also provide good interlayer adhesion, thereby removing the need for the liner layer 118. When used, the liner layer 118 may be deposited by a chemical vapor deposition process, such as the thermal enhanced or plasma enhanced decomposition of a niobium precursor. For deposition of the liner layer 118 by a chemical vapor deposition technique, the liner layer 118 is preferably exposed to a plasma of hydrogen and an inert gas, such as argon, to remove carbon and oxygen impurities and to reduce the resistivity of the liner layer 118.

Alternatively, the liner layer 118 may be deposited using an ionized metal plasma physical vapor deposition (IMP-PVD) process and can be deposited by other PVD processes, such as collimated or long throw sputtering. Collimated sputtering is generally performed by placing a collimator (not shown) between the target and the substrate to filter sputtered material traveling obliquely through the collimator. Long throw sputtering is generally performed by increasing the spacing between the target and the substrate. The increased distance increases the probability that the sputtered material reaching the substrate is directed normal to the substrate surface.

Thereafter, a barrier layer 119 composed of a metal nitride is conformally deposited according to the present invention on the liner layer 118 or on the dielectric layer 614 and the floor and walls of feature 616. The barrier layer 119 is deposited prior to the conducting metal layer 120 to prevent diffusion from the conducting metal layer 120 to the underlying substrate 112 or dielectric layer 114. According to the invention, the barrier layer 119 is deposited by thermal or plasma enhanced decomposition of a niobium nitride precursor having the formula $Nb(NRR')_5$, the formula $(NRR')_3Nb\!=\!NR''$, or combinations thereof in the presence of a processing gas. Additionally, the barrier layer 119 may also perform as an adhesion layer between the substrate 112 and the conducting metal layer 120 when a liner layer 118 is not used in the metallization stack. The barrier layer 119 may also perform as an seed layer for deposition of the conducting metal layer, preferably for a copper film, by an electroplating process.

The Nb(NRR'), precursor comprises Nb, the niobium metal to be deposited, and up to five volatile hydrocarbon ligands bonded to niobium. The ligand, NRR', comprises functional groups, R and R' bonded to a nitrogen (N) atom to form an amido compound, preferably a dialkylamido compound. The functional groups R and R' are selected from the group of alkyl compounds, alkenyl compounds, cycloalkyl compounds, cycloalkenyl compounds, aryl compounds, and combinations thereof. Preferably, R and R' are selected from the group of methyl, ethyl, n-propyl, iso-propyl, n-butyl, sec-butyl, tert-butyl, cyclopentadienyl, benzyl, phenyl, silylated derivatives thereof, fluorinated derivatives thereof, and combinations thereof. R and R' may have the same structure, such as a methyl group, or may have different structures as desired, such as a methyl R and an ethyl R'.

The functional groups R and R' may further comprise nitrogen containing compounds including cyclic amido groups such as piperdino or pyrolidino groups. An example of the Nb(NRR')$_5$ precursor is Nb(NMeEt)$_5$, pentakis (methylethylamido) niobium, where R is methyl (Me) and R' is ethyl (Et). If there are fewer than five dialkylamido ligands comprising the precursor, then alkyl substituted derivatives, having the composition of the R and R' functional groups may be used to form the remaining ligands with tantalum. One example of this alkyl substituted derivative is tert-butyl tetrakis (dimethylamido) niobium, Nb[N(CH$_3$)$_2$]$_4$[C(CH$_3$)$_3$].

The precursor (NRR')$_3$Nb=NR" comprises Nb, the niobium metal to be deposited, and up to four volatile hydrocarbon ligands bonded to niobium. Up to three ligand are dialkylamido functional groups further comprising functional groups, R and R' bonded to a nitrogen (N) atom to form an amido compound. The fourth ligand is an imido compound formed as a double bond between the metal and the nitrogen atom, with the remaining nitrogen valence forming a bond with the functional group R". Each R, R', and R" is selected from the group of an alkyl compound, alkenyl compound, cycloalkyl compound, cycloalkenyl compound, aryl compound, and combinations thereof, and may further comprise nitrogen containing compounds including cyclic amido groups such as piperdino or pyrolidino groups. Preferably, each R, R', and R" is selected from the group of methyl, ethyl, n-propyl, iso-propyl, n-butyl, sec-butyl, tert-butyl, cyclopentadienyl, benzyl, phenyl, silylated derivatives thereof, fluorinated derivatives thereof, and combinations thereof. Preferably, R" is methyl or ethyl when R and R' are methyl or ethyl groups.

Less than four ligands may comprise the precursor, however, a minimum of at least one amido group and one imido group are on the precursor. If there are less than three amido groups, then substituted derivatives having the composition of the R, R', and R" functional groups may be used to form the remaining ligands with niobium. An example of the (NRR')$_3$Nb=NR" precursor is (NMeEt)$_3$Nb=NMe, trikis(methylethylamido)methylimido niobium, where R is methyl (Me), R' is ethyl (Et), and R" is methyl (Me).

Thermal decomposition involves heating the substrate in the presence of a processing gas to cause the hydrocarbon portion of the volatile metal compound to decompose to volatile hydrocarbons which devolve from the surface of the substrate and are exhausted from the processing chamber while the metal of the precursor remains on the surface of the substrate. Preferred processing gases include hydrogen, nitrogen, ammonia, silane, argon, helium, and combinations thereof. The addition of an reactant processing gas, such as ammonia, the decomposition of the precursor is accelerated by the presence of reactant species, such as by a transammination reaction with ammonia, and allows a greater deposition rate than in the absence of a reactant processing gas.

An exemplary processing regime for depositing a metal nitride film with the above described precursor is as follows.

The organometallic precursor for a niobium nitride film is introduced into the chamber at a preferable flow rate of between about 5 sccm and about 500 sccm for a 200 mm substrate, while the processing chamber is maintained at a pressure between about 100 milliTorr and about 20 Torr, preferably between about 100 milliTorr and about 250 milliTorr, and most preferably about 150 milliTorr. Processing gases are introduced into the chamber at a flow rate of between about 5 sccm and about 500 sccm, with the flow rate preferably being maintained to produce a molar ratio of 1:1 of precursor to processing gas if a reactant processing gas is used. For deposition of the niobium imido precursor, (NRR')$_3$Nb=NR", a molar ratio of processing gas to precursor of greater than or equal to about 4:1 is used. The substrate is heated to and maintained at a temperature sufficiently high to cause decomposition of the organometallic precursor, with the exact temperature depending upon the identity and chemical, thermal, and stability makeup of the organometallic precursor and processing gases used under the deposition conditions. However, a temperature from between about room temperature and about 1000° C. is contemplated, preferably from between about 100° C. and about 450° C., and most preferably between about 250° C. and about 450° C. is used to ensure a complete reaction between the precursor and the processing gas on the substrate surface.

For plasma-enhanced CVD deposition of the precursor, power to generate a plasma is either capacitively or inductively coupled into the chamber to excite the plasma gases into excited neutrals and the like to enhance the chemical reactivity of the precursor and processing gases to enhance deposition of the film on the substrate. Power is provided to the processing gases at a power density ranging between about 0.03 W/cm$^2$ and about 3.2 W/cm$^2$, preferably between about 0.6 W/cm$^2$ and about 3.2 W/cm$^2$. For a 200 mm diameter substrate, power is provided at a power level of between about 200 Watts and about 1000 Watts, with about 750 Watts most preferably used. Preferably, the chamber pressure is maintained between about 100 milliTorr and about 20 Torr, preferably between about 100 milliTorr and about 250 milliTorr, during the plasma enhanced deposition process. The plasma enhanced decomposition of the precursor allows for an increased deposition rate, particularly in combination with a processing gas at a lower processing temperature. For a plasma enhanced deposition process, the temperature of the substrate is between about 100° C. and about 450° C., and more preferably between about 250° C. and about 450° C. For the niobium nitride layer, the above described processes produce a deposition rate of between about 30 angstroms (Å) and about 100 Å per minute, with a total layer thickness preferably from about 50 Å to about 100 Å thick, however, the nitride layer may be deposited to a thickness of about 10000 Å.

If the precursor cannot be delivered to the chamber as a gas, the precursor may be dissolved in a solvent and vaporized for delivery to the chamber. Aliphatic hydrocarbon based solvents, such as hexane and octane, may be used in the vaporized precursor process. For a vaporized precursor, the flow rates to the chamber is between about 5 and about 500 sccm for a 200 mm substrate and the chamber pressure would preferably be between about 100 milliTorr and about 20 Torr.

Preferably the above described decomposition of the precursor in the metal nitride process occurs in the presence of a reactant processing gas, preferably a gas such as ammonia or a hydrogen and nitrogen mixture which can reduce the precursor during decomposition by a transammination reaction and limit the amount of nitrogen in the deposited film. Additionally, argon, hydrogen, or nitrogen may also be used individually to react with the precursor to deposit the metal nitride film. Preferably, for a plasma enhanced decomposition, the processing gas comprises a reactant gas of hydrogen with the an inert gas, such as argon. Preferably, inert gases, such as the carrier gases argon and helium, are used to tune the conditions by selecting precursors that favor more or less nitrogen as desired.

The processing gas composition is especially key in metal nitride films where the Stoichiometry or phase of the deposited film will determine the film's characteristics and properties. Processing gases and plasmas that readily nitrate deposited films, such as nitrogen, may increase the nitrogen content of these films to undesirable levels. For conducting metal films, such as niobium, as the nitrogen content increases, the film becomes increasingly resistive, and less than desirable performance of the device can result.

By reacting with gases capable of trans-ammination reactions, or in the presence of an inert gas, it is believed that the nitrogen content of the film is limited to the amount of nitrogen contained in the precursor, and thus, the nitrogen content of the film can be controlled by controlling the composition of the precursor. The flow rate of the processing gases is preferably maintained at a molar ratio of 1:1 of precursor and processing gas to limit the nitrogen content of the film. For niobium precursors comprising imido groups, ammonia is the preferred processing gas with a preferred processing gas to precursor molar ratio of about 4:1 and greater to deposit a niobium nitride film. The excess processing gas is either consumed in the subsequent plasma or removed from the chamber prior to the plasma treatment.

The barrier properties of a metal nitride film may be improved by incorporating silicon into the film to form a metal silicon nitride film. A metal silicon nitride film may be deposited by heat degradation of an organometallic precursor in the presence of a processing gas containing silicon-hydrogen bonds, such as silane ($SiH_4$) and silane derivatives. The use of the metal nitrides and metal silicon nitride deposited by the precursors of the invention, such as tantalum nitride and tantalum silicon nitride, which have greater diffusion resistance and higher thermal stability than prior art materials, such as titanium and titanium nitride, will produce improved barrier films for copper metallization. By forgoing a post-deposition treatment of the film, a niobium carbon nitride may be deposited on the substrate.

The barrier layer 119 is preferably exposed to a post-deposition plasma to lower the film's resistivity, remove contaminants, and density the film to enhance barrier and liner properties. The plasma gas, preferably comprising argon, hydrogen, nitrogen, ammonia, and combinations thereof, is introduced into the chamber at a rate between about 5 sccm and about 500 sccm, while the processing chamber is maintained at a pressure between about 100 milliTorr and about 20 Torr, preferably between about 100 milliTorr and about 250 milliTorr. However, the flow rate and pressure conditions may vary for different makes, sizes, and models of the processing chambers used. The substrate temperature during the plasma step is about the same temperature range as for the precursor decomposition temperature range, preferably between about 150° C. and about 450° C., and more preferably between about 250° C. and about 450° C. However, the flow rate and pressure conditions may vary for different makes, sizes, and models of the processing chambers used. Power to generate a plasma is then either capacitively or inductively coupled into the chamber to excite the plasma gases into excited neutrals and the like which react with the deposited film on the substrate. Power is provided to the processing gases at a power density ranging between about 0.03 $W/cm^2$ and about 3.2 $W/cm^2$, preferably between about 0.6 $W/cm^2$ and about 3.2 $W/cm^2$. For a 200 mm diameter substrate, power is provided at a power level of between about 200 Watts and about 1000 Watts, with about 750 Watts most preferably used. In an preferred embodiment, a metal nitride film comprising niobium nitride is deposited in a processing gas comprising argon, hydrogen, and combinations thereof, and is treated with a plasma comprising argon, hydrogen, and combinations thereof.

It is believed that the properties and stoichiometry of the films are affected by the post-deposition plasma treatment. The plasma composition can also affect the nitrogen content of the deposited film by further adding nitrogen to the film and changing the metal nitride film's phase. By controlling the composition of the plasma gas, the phase of the metal nitrides can also be controlled. Non-conducting contaminants, such as carbon and oxygen impurities, in the deposited metal film may produce a film with high resistivities and less than desirable properties. Exposure to a plasma reduces the conductive resistivity of the film by the removal of non-conducting contaminants, such as carbon and oxygen, and may minimize the nitrogen content in the deposited metal nitride film. The plasma gas is preferably argon, hydrogen, ammonia and combinations thereof, but most preferably argon, is used in the post deposition plasma process to minimize the resistivity and densify the deposited film by removing contaminants. Preferably, for metal carbon nitride films, plasma treatments are not performed since the plasma treatment may remove the desired carbon content of the film. If a plasma treatment for a carbon nitride film is performed, the plasma gases preferably comprise inert gases, such as argon and helium. The deposition and plasma treatment of the deposited film may be performed in situ in the same chamber or may be performed in separate chambers.

Referring back to FIG. 1, a conducting metal layer 120, preferably copper, is then deposited on the barrier layer 119. The conducting metal layer 520 may comprise a seed layer of a conducting metal for a subsequent deposition of a metal layer by a electroplating or electroless process. Preferably, a single conducting metal layer 520 of copper is deposited to fill structure with copper. The copper layer 120 can be deposited by PVD, IMP, CVD, electroplating, electroless deposition, evaporation, or other known methods. Preferably, the conducting layer 120 is deposited using electroplating techniques. An exemplary electroplating method is described in co-pending U.S. patent application Ser. No. 09/114,865, filed on Jul. 13, 1998, and is incorporated herein by reference.

The feature 116 may be further processed by planarizing the top portion of the metallized film stack 100, preferably by chemical mechanical polishing (CMP). During the planarization process, portions of the copper layer 118 and the dielectric layer 114 are removed from the top of the structure leaving a fully planar surface with a conductive feature formed in the via 116 therein. Other subsequent processing can include annealing if desired, additional deposition of layers, etching, and other processes known to IC manufacturing.

It is believed that depositing the film and plasma treating the deposited film will produce a film with improved material properties. The plasma process will remove resistive constituents, such as contaminants of carbon and oxygen, from the film to lower the films resistivity and improve electrical conductivity. It is also believed that the contaminants are removed by the plasma by hydrogen species in the plasma reacting with the carbon impurities to produce volatile hydrocarbons that can easily desorb from the substrate surface and be purged from the processing zone and processing chamber. The inert gases in the plasma further bombards the oxygen and nitrogen contained in the film to break oxygen or nitrogen bonds and produce oxygen or nitrogen radicals which also desorb from the film. The plasma process will also densify the film and remove layering defects, thereby improving the deposited film's interlayer bonding and adhesion and diffusion resistance. Additionally, it is further believed that the post deposition plasma will densify material disposed at the bottom of substrate features in preference over material disposed on the sidewalls of the feature. This forms a more conductive film at the bottom of the feature, at the contact point between different levels of the device, than on the sidewalls where the feature typically contacts insulator materials.

A skilled practitioner in the art will understand the need to modify the metal and metal nitride deposition processes while retaining the basic nature of the processes for performance of the invention with respect to time, pressure, flow rates, plasma power, and temperature and regarding the use of variable equipment, processes, and desired film characteristics.

The Apparatus

The organometallic precursor is introduced into the processing chamber by either a liquid delivery system or a precursor vaporizer system. For processing in a liquid delivery system, the precursor is first dissolved in an aliphatic hydrocarbon solvent, such as hexane or octane, to reduce the viscosity of the liquid precursor. The precursor is then stored until a pressurized inert gas forces the precursor into a processing liquid path. A flow meter regulates the liquid precursor flow and the flow rate can be varied from 1 mg/min to 1000 mg/min, or any other amount needed for the deposition process. After the liquid flow meter, the precursor liquid is vaporized in a vaporizer and an inert carrier gas such as helium or argon carriers the precursor to the processing chamber, such as a CVD TxZ™ chamber available from Applied Materials of Santa Clara, Calif. The liquid delivery system vaporizer is often heated between about 50° C. and about 120° C. to facilitate the vaporization process.

Figure 2:
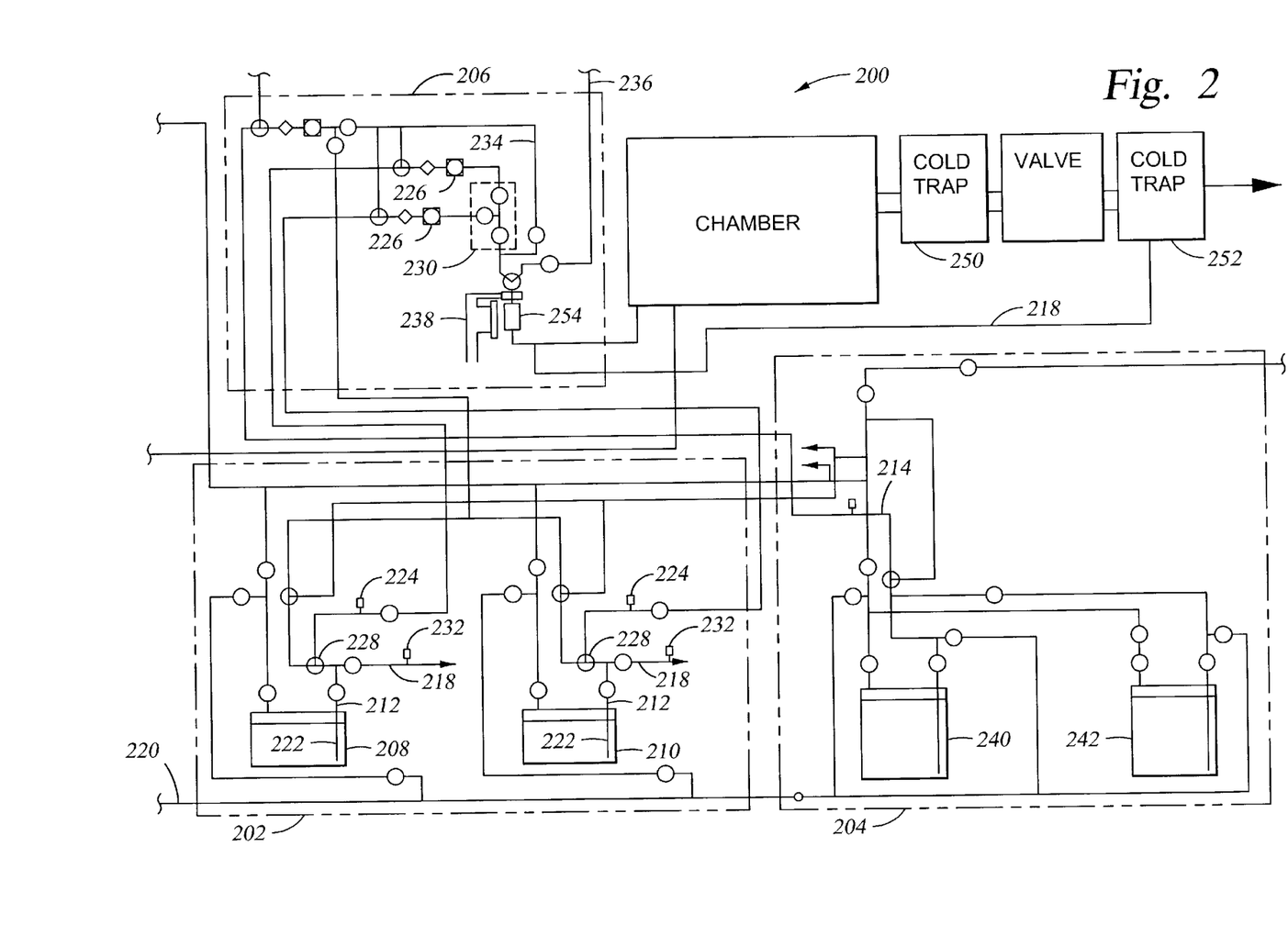
FIG. 2 is a schematic of a liquid delivery system.

FIG. 2 is a schematic view showing a liquid delivery system 200 of the present invention. The liquid delivery system generally includes a liquid precursor module 202, a solvent module 204 and a vaporizer module 206. In one embodiment, the liquid precursor module 202 includes two pressurized ampoules 208, 210 and a liquid delivery line 212 connected to each ampoule. Valves are disposed along the length of the liquid delivery lines to control flow of liquid from the ampoules to a mixing port and then into the vaporizer and to prevent collection of precursor within the system which can negatively affect process stabilization and/or repeatability.

The ampoules are designed to deliver the liquid precursors at high pressure, e.g., up to 500 psi, without having to rely on high pressure pumps, i.e., no high cycle mechanical pump with rubbing parts exposed to precursors. To provide the pressure, an inert gas such as argon is charged into the ampoules at a pressure of about 90 psi through line 220. A liquid outlet line 222 is disposed in the ampoule so that as the inert gas, e.g., argon, is delivered to the ampoule and the appropriate valves are opened, the liquid is forced out through the outlet through a suitable valve and into the liquid delivery line.

The delivery line 212 is connected from each ampoule to the vaporizer 254. A first valve is disposed on the outlet of the ampoule to control delivery of the liquid to the delivery line 212. The valve is preferably a three-way valve connecting the bypass line 218 and the liquid delivery line 212. The bypass line 218 in turn is connected to a second cold trap 252 and an exhaust manifold (not shown). A high pressure gauge 224 and a liquid flow controller (LFC) 226 are disposed downstream from a valve 228 introducing the solvent and the purge gas. The LFC controls delivery of the liquid to the mixing port 230 connected between the liquid precursor delivery lines. A low pressure gauge 232 is disposed on the bypass line 218 to monitor pressure in the line so that completion of the maintenance routine can be determined.

The liquid precursor delivery lines 212 deliver liquid precursors into the mixing port 230 upstream from the vaporizer 254. A solvent delivery line 234 also delivers a solvent into the liquid delivery line downstream from the mixing port where the liquid precursors and the solvent are mixed and delivered into the vaporizer. At the vaporizer 254, a carrier gas line 236 delivers a carrier gas into the delivery line to carry the liquid precursors and the solvent into the vaporizer 254 through the capillary tube or nozzle. In addition, a concentric carrier gas line 238 delivers a carrier gas around the nozzle or injection tip to ensure that even a small amount of liquid is delivered to the vaporizing surfaces. The delivery line from the mixing port and into the vaporizer is preferably made of a material having a low coefficient of friction, such as Teflon PTFE, and does not hang up in the line. This feature assists in the delivery of small volumes of liquid precursor.

The solvent module 204 includes one or more chargeable ampoules similar to the liquid precursor ampoules. Preferably, there are two solvent ampoules 240, 242 and two liquid precursor ampoules 208, 210. The liquid precursor ampoules can deliver two separate precursors which can be mixed at the mixing port or can deliver the same precursor together or alternatively.

The liquid precursor ampoules are designed with a slotted/sculptured bottom to draw the liquid downwardly in the ampoule so that the liquid may (1) be detected at very low levels and (2) be drawn out of the ampoule even at low levels. This is particularly important in dealing with expensive liquids which are preferably not wasted. In addition, the ampoules include an ultrasonic detector for discerning the volume of liquid in the ampoule even at low levels so that continuous processing may be achieved.

An optional cold trap 250 is disposed in the conduit connecting the exhaust pump to filter out the deposition material which may be detrimental to the pump. Additionally, a second cold trap 252 is disposed downstream from the first cold trap and is connected to a bypass line 218 from the vaporizer. The bypass line 218 and related cold trap 252 allow the system to operate in a continuous flow made by allowing delivery of vaporized material thereto during substrate transfer and plasma processing. By this method, the system may continually vaporize precursors but deliver the vaporized material to the processing chamber for deposition or to the exhaust system through a bypass line. The continual flow of the vaporized precursor enables stabilization of the deposition process over a number of substrates by providing consistent deposition processing conditions through optimization and maintenance of the vaporization process.

Improved filtration of the deposition material may be accomplished by providing a cold trap 252 comprising a cold unit and a hot unit (not shown). The cold unit of the cold trap provides for removal of particulate material by condensation on the cold trap surface. The hot unit provides for removal of unreacted precursor vapor by having a temperature above the degradation temperature of the deposition precursor, thereby depositing the precursor material on the unit.

Figure 3A:
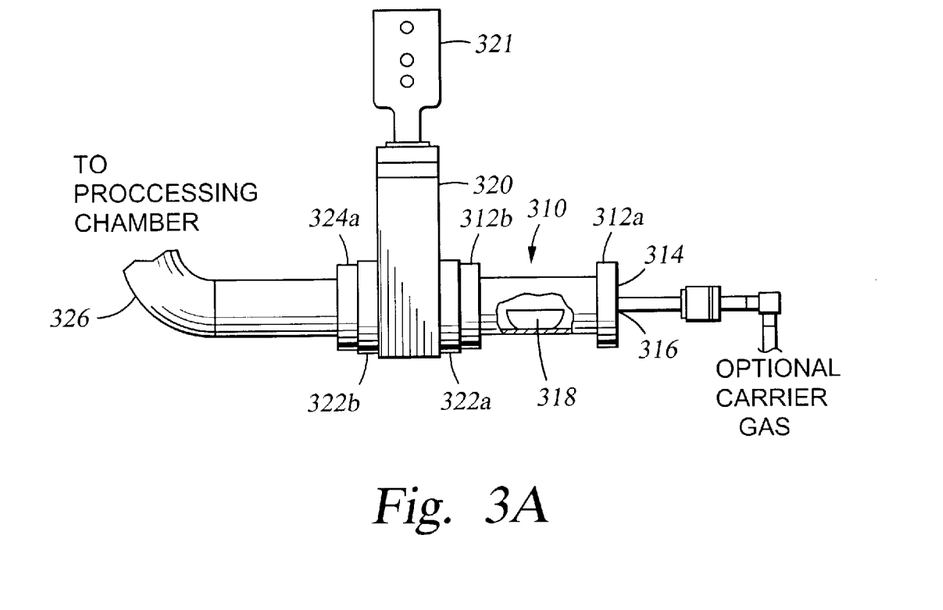
FIG. 3A is a partially sectioned view of a precursor vaporization apparatus showing a vaporizer, a decomposition chamber, and a manifold for supplying reactive vapors into the deposition chamber.

FIG. 3A shows a precursor vaporizer system, where a vaporizer 310 is provided to heat and vaporize or sublime the precursor. The vaporizer 310 generally comprises a metal cylinder of stainless steel or aluminum. A heated pressure gauge (not shown) is located in the vaporizer to monitor the pressure of the vaporizer to insure that a continuous feed of particulate solid or liquid precursor is provided to the vaporizer 310. The pressure gauge is preferably heated so that material will not deposit or decompose on the gauge and render the gauge inoperable.

One embodiment of a vaporization chamber or vaporizer 310 is shown heating the starting material to vaporize or sublime a liquid or solid precursor material before introducing it into the deposition chamber or blending it with another precursor. A gas inlet port 316 permits the flow of a non-reactive gas into vaporizer 310. A gate valve 320 separates the vaporizer 310 from the processing chamber (not shown). Within vaporizer 310, as shown in FIG. 3A, is a containment vessel 318 for placement of the precursor. The containment vessel 318, which may rest on the inner surface of the vaporizer 310, is made of a non-reactive material, usually a ceramic material, and preferably comprises quartz.

The pressure in vaporizer 310 may be maintained at atmospheric pressure, but for the chemical vapor deposition process, the pressure is preferably maintained from about 30 milliTorr and about 20 Torr, or any suitable pressure used by the CVD processing chamber for deposition of the precursor. The increase in total pressure up to 20 Torr increases the deposition rate of the precursor and allows better control of the amount of precursor that is provided to the deposition chamber. The carrier gas can be any inert gas, preferably helium or argon, and most preferably argon.

The temperature of vaporizer 310, when operated within the previously described pressure ranges, will usually vary from a minimum temperature below which the material will not vaporize, at the pressure required for deposition, up to a maximum temperature below the temperature at which the vaporized material will decompose, at the operative pressure. The substituent groups on the precursor have a strong influence on the boiling point and decomposition temperature of the precursor, which provides for operating temperature that reflect the decomposition temperatures of the individual precursors. While the operating temperature of the vaporizer will vary according to the material to be vaporized, the temperature is preferably maintained between about 50° C. and about 200° C.

Figure 3B:
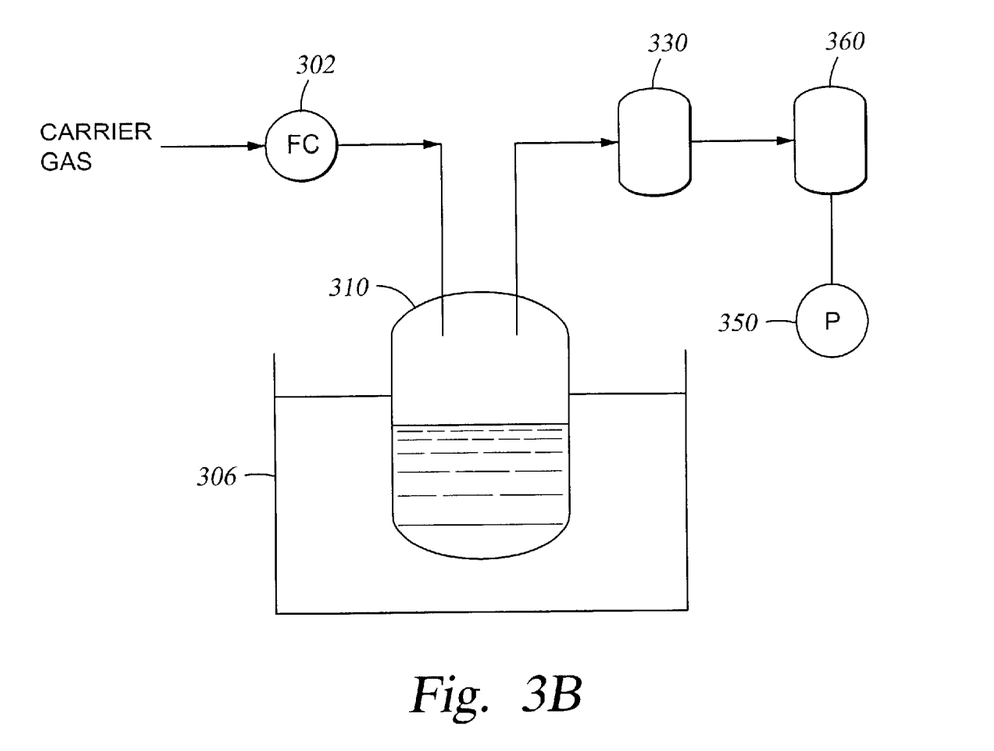
FIG. 3B is a schematic view of a carrier gas delivery system for transporting a precursor material from a vaporizer to a deposition chamber.

An alternative embodiment for the vaporizer 310 is shown in FIG. 3B where a thermostatic oven 306 heats the vaporizer 310 which contains, for example, non-vaporized and vaporized precursor. The carrier gas is passed through a flow controller 302 such as a metering pump or a needle valve and is bubbled through the non-vaporized precursor in the vaporizer 310. The combined carrier gas and vaporized precursor are then passed to the processing chamber by a rough pump 350. A mass flow meter (not shown) can be placed anywhere between the vaporizer 310 and the deposition chamber to measure the total mass leaving the vaporizer 310. The flow rate of precursor can then be calculated by subtracting the mass of carrier gas sent to the vaporizer 310 from the mass of material leaving the vaporizer 310.

Figure 4:
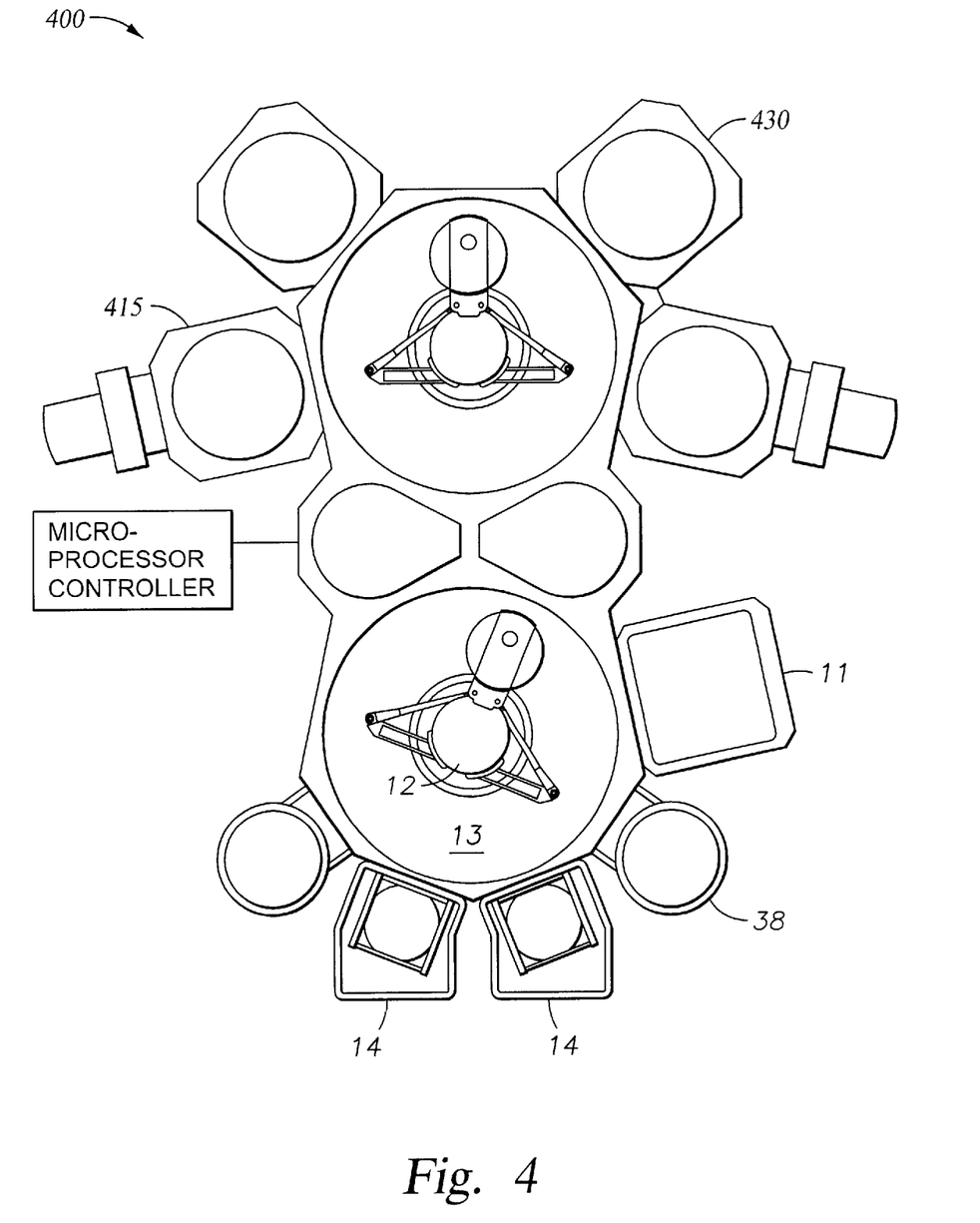
FIG. 4 is a schematic top view of an integrated multi-chamber apparatus suitable for performing CVD and PVD processes on a substrate.

Referring to FIG. 4, a schematic diagram of an exemplary integrated cluster tool 400 suitable for performing the CVD and PVD processes of the present invention is shown. The methods of the present invention are preferably carried out in an integrated cluster tool that has been programmed to process a substrate accordingly. One exemplary apparatus suitable for use with the processes of the invention is an "ENDURA" system commercially available from Applied Materials, Inc., Santa Clara, Calif. A similar staged-vacuum substrate processing system is disclosed in U.S. Pat. No. 5,186,718, entitled Staged-Vacuum Substrate Processing System and Method, Tepman et al., issued on Feb. 16, 1993, which is hereby incorporated herein by reference. The particular embodiment of the apparatus 400 shown herein is suitable for processing planar substrates, such as semiconductor substrates, and is provided to illustrate the invention, and should not be used to limit the scope of the invention. The apparatus 400 typically comprises a cluster of interconnected process chambers, for example, a CVD chamber 430, and a PVD chamber 415.

The apparatus 400 includes at least one enclosed PVD deposition chamber 415 for performing PVD processes, such as sputtering. A metal layer, such as niobium, of the invention may be sputtered from a niobium target in a PVD chamber. The PVD chamber 415 comprises a sputtering target of sputtering material facing the substrate. The target is electrically isolated from the chamber and serves as a process electrode for generating a sputtering plasma. During the sputtering process, a sputtering gas, such as argon or xenon, is introduced into the chamber 415. An RF bias current is applied to the sputtering target, and the support supporting the substrate in the chamber is electrically grounded. The resultant electric field in the chamber 415 ionizes sputtering gas to form a sputtering plasma that sputters the target causing deposition of material on the substrate. In sputtering processes, the plasma is typically generated by applying a DC or RF voltage at a power level from about 100 and about 20,000 Watts, and more typically from about 100 to 10,000 Watts, to the sputtering target.

Figure 5:
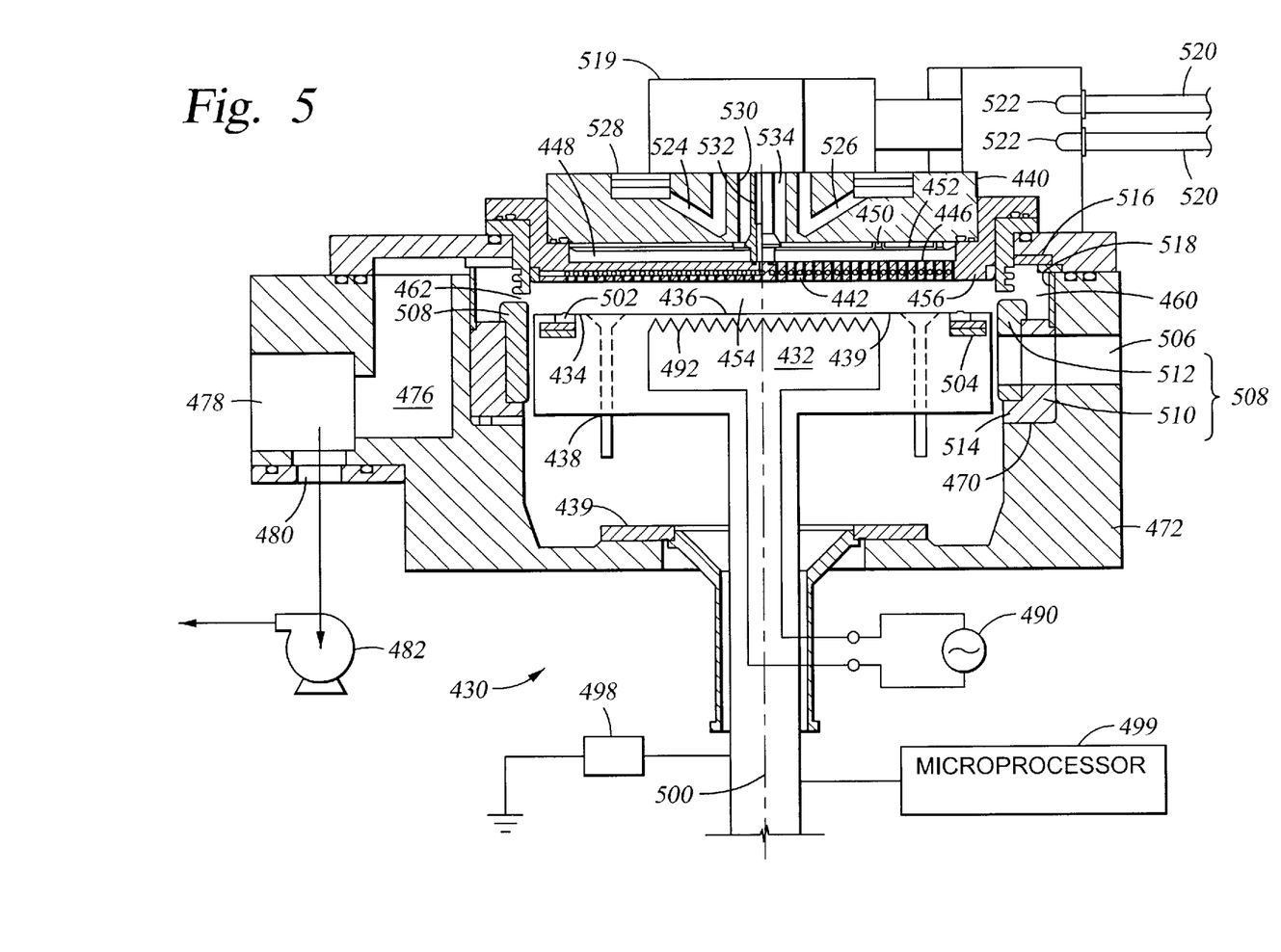
FIG. 5 is a schematic cross-sectional view of a CVD chamber suitable for performing CVD deposition processes of the present invention chamber.

Referring to FIG. 5, a schematic cross-sectional view of a suitable CVD plasma for performing the processes of the invention is shown. The methods of the present invention are preferably carried out in a processing chamber that has been programmed to process a substrate accordingly. A preferred CVD chamber is known as the CVD TxZ chamber and is available commercially from Applied Materials, Inc., of Santa Clara, Calif. The CVD TxZ chamber is suitable for the deposition of an organometallic precursor of the present invention in the presence of a processing gas for depositing a metal and/or metal nitride layer by either the thermal or plasma enhanced decomposition process.

In a preferred embodiment of the processing chamber, a dual manifold distributor, or showerhead 440, provides for the introduction of the precursor and of the processing gases to the processing zone. An exemplary dual manifold showerhead is shown in U. S. patent application Ser. No. 09/207, 780, entitled "Dual Channel Gas Distribution Plate", filed on Dec. 9, 1998, which is assigned to common assignee and incorporated herein by reference.

In the thermal or heat decomposition deposition process, an organometallic precursor gas of the present invention, is injected into the chamber through the showerhead 440 at a preferable pressure from about 100 milliTorr and about 20 Torr while the pedestal 432 holds the substrate 436 at an elevated temperature above the decomposition temperature of the organometallic precursor of about 100° C. and about 450° C., preferably from about 250° C. and about 450° C. The processing gas in introduced into the system through a second manifold in the shower head 440 to a volume located directly above the substrate and facilitates deposition of the film. Thereby, a metal and/or metal nitride layer is conformally deposited on the substrate 436 in a CVD process. The heat decomposition process is a thermal process not usually relying upon plasma excitation of the precursor gas. If a plasma is desired during the deposition process or as a post deposition plasma treatment to remove impurities and density the film, sufficient voltage and power is applied by the RF source 494 to cause the process gas in the processing region 456 between the showerhead 440 and the pedestal 432 to discharge and to form a plasma.

The CVD chamber 430 includes a pedestal 432 supporting a substrate 436 on a supporting surface 434 to be deposited by CVD with a layer of material, such as a NbN layer of the present invention. Lift pins 438 are slidable within the pedestal 432 but are kept from falling out by conical heads on their upper ends. The lower ends of the lift pins 438 are engageable with vertically movable lifting ring 439 and thus can be lifted above the surface 434 of the pedestal 432. The surface 434 has a smaller diameter than that of the substrate 436 resting thereon. With pedestal 432 in a lower loading position (slightly lower than a slit valve identified as "506" below), a robot blade (not shown) in cooperation with the lift pins 438 and the lifting ring 439 transfers the substrate 436 in and out of the chamber 430 through the slit valve 506, which can be vacuum-sealed to prevent the flow of gas into or out of the chamber through slit valve 506. Lift pins 438 raise an inserted substrate 436 off the robot blade, and then the pedestal 432 rises to transfer the substrate 436 the lift pins 438 onto the supporting surface 434 of the pedestal 432. A suitable robotics transfer assembly is described in commonly-assigned U.S. Pat. No. 4,951,601, issued to Maydan, the complete disclosure of which is incorporated herein by reference.

The process gas is injected into the reactor 430 through a central gas inlet 530 in a gas-feed cover plate 446 houses a coaxially disposed gas delivery conduit 532. The conduit 532 channels a second gas into the processing region 454, which is received at a lower end of the conduit 532, and delivers a gas to the second gas pathway (not shown), which includes the second set of horizontal channels. The central bore 530 and the outer perimeter of the conduit 532 define a gas delivery passage 534, such as an annulus, which delivers a gas above the perforated blocker plate 452 to a first disk-shaped space or region 448 and from thence through passageways 450 in a baffle plate (or a gas blocker plate) 452 to a second disk-shaped space or region 454 in back of the showerhead 440. The showerhead 440 includes a large number of holes or passageways 442 for jetting the process gases into a processing region or zone 456. More specifically, process gas passes from the space or void 454, through the passageways 442 and into the processing space or zone 456 and towards the substrate 436.

The process gas jets from the holes 442 in the showerhead 440 into the processing space or zone 456 between the showerhead 440 and pedestal 432 so as to react at the surface of the substrate 436. The process gas byproducts subsequently flow radially outwardly with respect to a central axis 500 across the edge of the substrate 436, and across a peripheral centering right 502 which is disposed in an annular ledge 504 recessed in the upper periphery of a pedestal 432. Then into an annular pumping channel 460 surrounding the upper periphery of the pedestal 432 when pedestal 432 is in the processing position.

The pumping channel 460 is connected through a constricted exhaust aperture 462 to a pumping plenum 476, and a valve 478 gates the exhaust through an exhaust vent 480 to a vacuum pump 482. The restricted choke aperture 462 creates a nearly uniform pressure around the circumferential pumping channel 460. The process gas and its reaction byproducts flow from the center of the showerhead 440 across the substrate 436 and the periphery of the pedestal 432 and then through the choke aperture 462 to the pumping channel 460. The gas then flows circumferentially in the pumping channel 460 to the exhaust aperture 474 and then through the exhaust plenum 476 and the exhaust vent 480 to the vacuum pump 482. Because of the restriction 462 the gas flow across the substrate 436 is nearly uniform in the azimuthal direction.

As shown in FIG. 5, the ledge 470 in the chamber body 472 supports an insulating annular chamber insert 508 composed of a insulating chamber ring 510 and a band shield 512, which forms the bottom of the pumping channel 460. The chamber lid rim 466 forms the top and part of the outside wall of the pumping channel 460 along with the part of the chamber body 472. The inside upper edge of the pumping channel 460 is formed by the isolator ring 464, which is made of a ceramic or other electrically insulating material which insulates the metallic showerhead 40 from the chamber body 472.

The CVD reactor 430 of FIG. 5 can be operated in two modes, thermal and plasma-enhanced. In the thermal mode, an electrical power source 490 supplies power to a resistive heater 492 at the top of the pedestal 432 to thereby heat the pedestal 432 and thus the substrate 436 to an elevated temperature sufficient to thermally activate the CVD deposition reaction. In the plasma-enhanced mode, an RF electrical source 494 is passed by a switch 496 to the metallic showerhead 440, which thus acts as an electrode. The showerhead 440 is electrically insulated from the lid rim 466 and the main chamber body 472 by the annular isolator ring 464, typically formed of an electrically non-conductive ceramic. The pedestal 432 is connected to a biasing element 498 associated with the RF source 494 so that RF power is split between the showerhead 440 and the pedestal 432. Sufficient voltage and power is applied by the RF source 494 to cause the process gas in the processing region 456 between the showerhead 440 and the pedestal 432 to discharge and to form a plasma. A microprocessor controller 499 is provided to monitor and control the deposition processes performed in the chamber 430.

The generally illustrated chamber insert 508 includes an L-shaped insulating ceramic ring 510 resting on the inside ledge 470 of the main chamber body 472 and also includes an annular or band shield 512 resting on an inside ledge 514 on the L-shaped ring 510 and spaced from the pedestal 432 and the centering ring 502 by a small gap. Ceramic chamber liners of themselves are well known, for example, as described by Robertson et al. in U.S. Pat. No. 5,366,585 incorporated herein by reference thereto. The band shield 512 is preferably made of a metal, such as aluminum, and extends vertically upwardly substantially above the top of the L-shaped ceramic ring 510 and to a lesser extent above the supporting surface 434 of the pedestal 432.

The lid liner 516 is metallic and is both thermally and electrically connected to the lid rim 466, effectively forming an extension of it, and because of its remote location does not easily affect the plasma in the processing region 456. Any metal depositing on the lid liner 516 will not further affect the plasma as long as the metal does not extend over the isolator ring 464. In any case, the lid liner 516 is easily removed by means of a fastener (not shown) when it becomes excessively coated.

The centering ring 502 performs two functions. It acts to precisely center the substrate 436 on the pedestal 432, the substrate 436 having been transferred into the chamber and onto the pedestal 432 by a robot blade (not shown) moving through the access passageway 506. This function blends with a retaining function in which the peripheral centering ring 502 acts as a retaining ring to told the substrate 536 within its opening. Additionally, the centering ring 502 acts as a thermal blanket for the portion of the pedestal 432 exposed outside of the substrate 436. Specifically, its thermal characteristics are designed in view of the intended process so that the centering ring 502 thermally floats relative to the heated pedestal 432 and remains relatively cool compared to the substrate 436 and significantly cooler than the underlying pedestal 432, and thus little material is deposited on it during thermal CVD processing.

Figure 6:
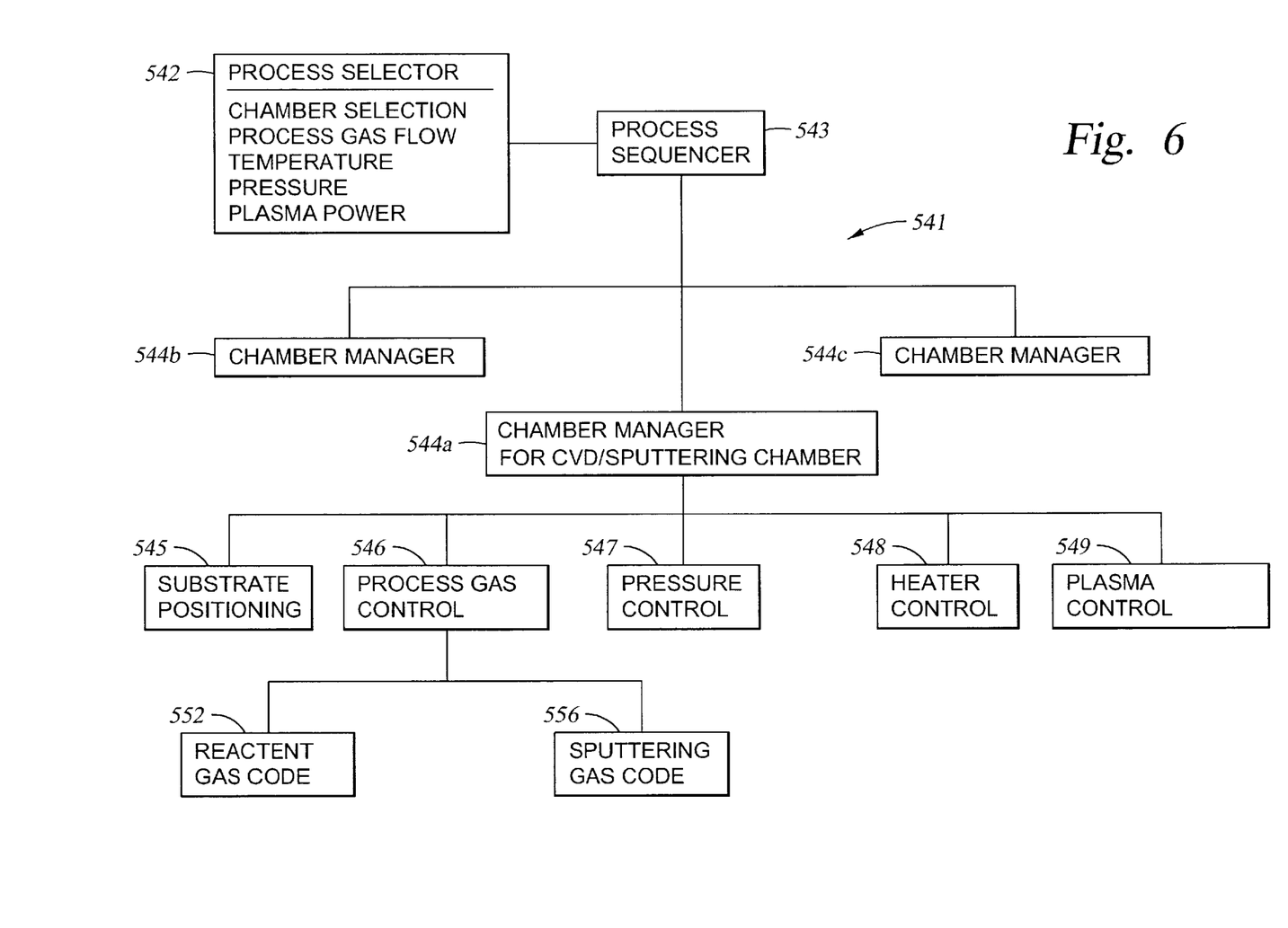
FIG. 6 is a simplified block diagram showing the hierarchical control structure of a computer program of the present invention.

FIG. 6 shows an illustrative block diagram of the hierarchical control structure of the computer program 541 of the microprocessor controller 499. A user enters a process set number and process chamber number into a process selector subroutine 542 in response to menus or screens displayed on the CRT monitor by using the light pen interface. Tile process sets are predetermined sets of process parameters necessary to carry out specified processes, and are identified by predefined set numbers. Process selector subroutine 542 identifies (i) the desired process chamber in a multi-chamber system, and (ii) the desired set of process parameters needed to operate the process chamber for performing the desired process. The process parameters for performing a specific process relate to process conditions such as, for example, process gas composition and flow rates, temperature, pressure, plasma conditions such as RF power levels, and chamber dome temperature, and are provided to the user in the form of a recipe. The parameters specified by the recipe are entered utilizing a light pen/CRT monitor interface (not shown).

A process sequencer subroutine 543 comprises program code for accepting the identified process chamber and set of process parameters from the process selector subroutine 542, and for controlling operation of the various process chambers. Multiple users can enter process set numbers and process chamber numbers, or a user can enter multiple process set numbers and process chamber numbers, so the sequencer subroutine 543 operates to schedule the selected processes in the desired sequence. Preferably the sequencer subroutine 543 includes a program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, the sequencer subroutine 543 can be designed to take into consideration the present condition of the process chamber being used in comparison with the desired process conditions for a 30 selected process, or the "age" of each particular user entered request, or any other relevant factor a system programmer desires to include for determining scheduling priorities.

After sequencer subroutine 543 determines which process chamber and process set combination is going to be executed next, sequencer subroutine 543 causes execution of the process set by passing the particular process set parameters to a chamber manager subroutine 544A–C, which controls multiple processing tasks in CVD chamber 430 and possibly other chambers (not shown) according to tile process set determined by sequencer subroutine 543.

Once the sequencer subroutine 543 determines which process chamber and process set combination is going to be executed next, the sequencer subroutine 543 causes execution of the process set by passing the particular process set parameters to the chamber manager subroutines 544A–C which control multiple processing tasks in different process chambers according to the process set determined by the sequencer subroutine 543. For example, the chamber-manager subroutine 544A comprises program code for controlling CVD process operations, within the described process chamber 430 of FIG. 5.

The chamber manager subroutine 544 also controls execution of various chamber component subroutines or program code modules, which control operation of the chamber components necessary to carry out the selected process set. Examples of chamber component subroutines are substrate positioning subroutine 545, process gas control subroutine 546, pressure control subroutine 547, heater control subroutine 548, and plasma control subroutine 549. Those having ordinary skill in the art will recognize that other chamber control subroutines can be included depending on what processes are desired to be performed in chamber 430 (shown in FIG. 5). In operation, chamber manager subroutine 544A selectively schedules or calls the process component subroutines in accordance with the particular process set being executed. Scheduling by chamber manager subroutine 544A is performed in a manner similar to that used by sequencer subroutine 543 in scheduling which process chamber and process set to execute. Typically, chamber manager subroutine 544A includes steps of monitoring the various chamber components, determining which components need to be operated based on the process parameters for the process set to be executed, and causing execution of a chamber component subroutine responsive to the monitoring and determining steps.

EXAMPLES

The following hypothetical examples demonstrate deposition of a precursor of the present invention to deposit metal nitride films having excellent barrier and adhesion properties. The examples were undertaken using a chemical vapor deposition chamber, and in particular, a "CENTURA TxZ™" system capable of both thermal decomposition and plasma enhanced chemical vapor deposition processes, and sold by Applied Materials, Inc., Santa Clara, Calif.

Niobium Film Deposition: Thermal Decomposition, Inert Gas

A niobium nitride (NbN) film is deposited by a vaporized precursor with a 1:1 molar ratio of $Nb(NMeEt)_5$, pentakis (methylethylamido) niobium to hydrocarbon solvent at a chamber pressure of 1 Torr with a substrate temperature of 380° C. and chamber walls at a temperature of 80° C. from materials which are introduced into the chamber at the flow rates as follows:

| | |
|---|---|
| $Nb(NMeEt)_5$, pentakis(methylethylamido)niobium, at | 25 sccm |
| Argon, Ar, at | 100 sccm. |

A subsequent in situ plasma treatment of the niobium nitride film is preformed at a chamber pressure of 1 Torr with 750 W of high frequency power (13.6 MHz) applied to the showerhead for contaminant removal of the deposited niobium nitride layer, the plasma gases flow into the reactor as follows:

| | |
|---|---|
| Nb(NMeEt)₅, pentakis(methylethylamido)niobium, at | 0 sccm |
| Argon, Ar, at | 100 sccm. |

Niobium Film Deposition: Thermal Decomposition, Ammonia

A niobium nitride (NbN) film is deposited by a vaporized precursor with a 1:1 molar ratio of (NMeEt)₃Nb=NMe, trikis(methylethylamido)methylimido niobium to hydrocarbon solvent and a 4:1 molar ratio of processing gas to precursor at a chamber pressure of 1 Torr with a substrate temperature of 380° C. and chamber walls at a temperature of 80° C. from materials which are introduced into the chamber at the flow rates as follows:

| | |
|---|---|
| (NMeEt)₃Nb=NMe, trikis(methylethylamido)methylimido niobium, at | 25 sccm |
| Ammonia, NH₃, at | 100 sccm |
| Argon, Ar, at | 100 sccm. |

A subsequent in situ plasma treatment of the metal nitride film is performed at a chamber pressure of about 1 Torr with 750 W of high frequency power (13.6 MHz) applied to the showerhead for contaminant removal of the deposited niobium nitride layer, the plasma gases flow into the reactor as follows:

| | |
|---|---|
| (NMeEt)₃Nb=NMe, trikis(methylethylamido)methylimido niobium, at | 0 sccm |
| Ammonia, NH₃, at | 100 sccm |
| Argon, Ar, at | 100 sccm. |

Niobium Film Deposition: Plasma Decomposition, Inert Gas

A niobium nitride (NbN) film is deposited by a vaporized precursor with a 1:1 molar ratio of Nb(NMeEt)₅, pentakis(methylethylamido) niobium to a hydrocarbon solvent at a chamber pressure of 1 Torr with a substrate temperature of 380° C. and chamber walls at a temperature of 80° C. from materials which are introduced into the chamber at the flow rates as follows:

| | |
|---|---|
| Nb(NMeEt)₅, pentakis(methylethylamido)niobium, at | 25 sccm |
| Argon, Ar, at | 100 sccm. |

A plasma is generated at a high frequency power (13.6 MHz) of about 750 Watts to deposit the metal nitride film. A subsequent in situ plasma treatment of the niobium nitride film is performed at a chamber pressure of 1 Torr with 750 W of high frequency power (13.6 MHz) is applied to the showerhead for contaminant removal of the deposited niobium nitride layer, the plasma gases flow into the reactor as follows:

| | |
|---|---|
| Nb(NMeEt)₅, pentakis(methylethylamido)niobium, at | 0 sccm |
| Hydrogen, H₂, at | 25 sccm |
| Argon, Ar, at | 100 sccm. |

Niobium Film Deposition: Thermal Decomposition, Ammonia

A niobium nitride (NbN) film is deposited by a vaporized precursor with a 1:1 molar ratio of (NMeEt)₃Nb=NMe, trikis(methylethylamido)methylimido niobium to hydrocarbon solvent and a 1:1 molar ratio of processing gas to precursor at a chamber pressure of 1 Torr with a substrate temperature of 380° C. and chamber walls at a temperature of 80° C. from materials which are introduced into the chamber at the flow rates as follows:

| | |
|---|---|
| Nb(NMeEt)₅, pentakis(methylethylamido)niobium, at | 25 sccm |
| Ammonia, NH₃, at | 100 sccm |
| Argon, Ar, at | 100 sccm. |

A plasma is generated at a high frequency power (13.6 MHz) of about 750 Watts to deposit the metal nitride film. A subsequent in situ plasma treatment of the metal nitride film is performed at a chamber pressure of about 1 Torr with 750 W of high frequency power (13 MHz) is applied to the showerhead for contaminant removal of the deposited niobium nitride layer, the plasma gases flow into the reactor as follows:

| | |
|---|---|
| Nb(NMeEt)₅, pentakis(methylethylamido)niobium, at | 0 sccm |
| Ammonia, NH₃, at | 0 sccm |
| Argon, Ar, at | 100 sccm. |

Thus, while the present invention has been described herein with reference to particularly embodiments thereof, a latitude of modification, various changes and substitutions are intended in the foregoing disclosure, and it will be appreciated that in some instances some features of the invention will be employed without a corresponding use of other features without departing from the scope and spirit of the invention as set forth.

What is claimed is:

1. A method for depositing a metal nitride film on a substrate, comprising:

introducing a organometallic precursor into a processing chamber, wherein the organometallic precursor is selected from the group of compounds having the formulas of Nb(NRR')₅. (NRR')₃Nb=NR", and combinations thereof, wherein:

R is a first organic functional group selected from the group consisting of alkyl, alkenyl, cycloalkyl, cycloalkenyl, aryl, and combinations thereof, R' is a second organic functional group selected from the group consisting of alkyl, alkenyl, cycloalkyl, cycloalkenyl, aryl, and combinations thereof, R" is a third organic functional group selected from the group consisting of alkyl, alkenyl, cycloalkyl, cycloalkenyl, aryl, and combinations thereof;

introducing a processing gas into the processing chamber;

generating a plasma of the processing gas and organometallic precursor in the processing chamber; and decomposing the organometallic precursor at a pressure of less than about 20 Torr to deposit the metal nitride film.

2. The method of claim 1, wherein each R, R', and R" is selected from the group consisting of methyl, ethyl, n-propyl, iso-propyl, n-butyl, sec-butyl, tert-butyl, cyclopentadienyl, benzyl, phenyl, silylated derivatives thereof, fluorinated derivatives thereof, and combinations thereof.

3. The method of claim 1, wherein R, R', and R", are the same organic functional group.

4. The method of claim 3, wherein R, R', and R", are methyl.

5. The method of claim 1, wherein R is methyl, R' is ethyl, and R" is methyl or ethyl.

6. The method of claim 1, wherein the processing gas is selected from the group consisting of hydrogen, nitrogen, ammonia, silane, argon, helium, and combinations thereof.

7. The method of claim 1, wherein decomposing the organometallic precursor comprises heating the substrate to a temperature between about 100° C. and about 450° C.

8. The method of claim 1, wherein generating the plasma comprises capacitively coupling energy into the process zone at a power density of between about 0.6 W/cm$^2$ and about 3.2 W/cm$^2$.

9. The method of claim 1, wherein the processing chamber is maintained at a pressure of between about 100 milliTorr and about 20 Torr.

10. The method of claim 1, further comprising exposing the metal nitride layer to a second plasma generated at a power density of between about 0.6 W/cm$^2$ and about 3.2 W/cm$^2$ following deposition of the metal nitride film.

11. The method of claim 10, wherein the wherein the second plasma comprises a gas selected from the group consisting of hydrogen, nitrogen, ammonia, argon, helium, and combinations thereof.

12. The method of claim 1, wherein the organometallic precursor has the formula (NRR')$_3$Nb=NR", and is exposed to the processing gas in a processing gas to organometallic precursor molar ratio of about 4:1 and greater.

13. The method of claim 1, wherein generating the plasma of the organometallic precursor and the first processing gas comprises capacitively coupling energy into the process zone at a power density of between about 0.6 W/cm$^2$ and about 32 W/cm$^2$.

14. The method of claim 1, wherein the second plasma of the second processing gas is generated at a power density of between about 0.6 W/cm$^2$ and about 3.2 W/cm$^2$.

15. A method for depositing a metal nitride film on a substrate, comprising:

introducing an organometallic precursor into a processing chamber, wherein the organometallic precursor is selected from the group of compounds of the formula Nb(NRR')$_5$, the formula (NRR')$_3$Nb=NR", and combinations thereof, wherein each R, R', and R" is selected from the group consisting of methyl, ethyl, n-propyl, isopropyl, n-butyl, sec-butyl, tert-butyl, cyclopentadienyl, benzyl, phenyl, silylated derivatives thereof, fluorinated derivatives thereof, and combinations thereof;

introducing a first processing gas selected from the group of hydrogen, nitrogen, ammonia, silane, argon, helium, and combinations thereof into the processing chamber;

generating a plasma of the organometallic precursor and the first processing gas in the processing chamber;

decomposing the organometallic precursor at a pressure between about 100 milliTorr and about 20 Torr to deposit the metal nitride film; and exposing the metal nitride film to a second plasma of a second processing gas selected from the group of hydrogen, nitrogen, ammonia, argon, helium, and combinations thereof, to densify the metal nitride film.

16. The method of claim 15, wherein R, R', and R", are the same organic functional group.

17. The method of claim 16, wherein R, R', and R", are methyl.

18. The method of claim 15, wherein R is methyl, R' is ethyl, and R" is methyl or ethyl.

19. The method of claim 15, wherein decomposing the organometallic precursor comprises heating the substrate to a temperature between about 100° C. and about 450° C.

20. The method of claim 15, wherein the organometallic precursor has the formula (NRR')$_3$Nb=NR", wherein R, R', and R", are methyl, and is exposed to the processing gas in a processing gas to organometallic precursor molar ratio of about 4:1 and greater.

* * * * *

UNITED STATES PATENT AND TRADEMARK OFFICE
CERTIFICATE OF CORRECTION

PATENT NO. : 6,475,902 B1
DATED : November 5, 2002
INVENTOR(S) : Hausmann et al.

It is certified that error appears in the above-identified patent and that said Letters Patent is hereby corrected as shown below:

Column 2,
Line 54, please change "NR△" to -- NR" --.

Column 6,
Line 62, please change "Nb(NRR')," to -- Nb(NRR')$_5$ --.

Column 9,
Line 49, please change "density" to -- densify --.

Column 16,
Line 21, please change "showerhead 40" to -- showerhead 440 --.

Column 17,
Line 5, please change "told" to -- hold --.
Line 19, please change "Tile" to -- The --.
Line 54, please delete "30".
Line 64, please change "tile" to -- the --.

Column 21,
Line 36, please change "32 W/cm$^2$" to -- 3.2 W/cm$^2$ --.

Signed and Sealed this

Thirtieth Day of December, 2003

JAMES E. ROGAN
*Director of the United States Patent and Trademark Office*